US006603295B2

(12) United States Patent
Reithmaier et al.

(10) Patent No.: US 6,603,295 B2
(45) Date of Patent: Aug. 5, 2003

(54) CIRCUIT CONFIGURATION FOR THE GENERATION OF A REFERENCE VOLTAGE

(75) Inventors: Stefan Reithmaier, Vilsheim (DE); Gerhard Thiele, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 57 days.

(21) Appl. No.: 10/051,239

(22) Filed: Jan. 18, 2002

(65) Prior Publication Data

US 2002/0121888 A1 Sep. 5, 2002

(30) Foreign Application Priority Data

Jan. 18, 2001 (DE) ........................................ 101 02 129

(51) Int. Cl.[7] .............................. G05F 3/16; H03K 3/27

(52) U.S. Cl. ....................................... 323/313; 327/542

(58) Field of Search ................................ 323/312, 313, 323/314, 315; 327/540, 541, 542

(56) References Cited

U.S. PATENT DOCUMENTS 4,649,291 A * 3/1987 Konishi ...................... 323/313
5,384,740 A * 1/1995 Etoh et al. .................. 323/313
5,804,958 A * 9/1998 Tsui et al. .................. 323/313

* cited by examiner

*Primary Examiner*—Jessica Han
(74) *Attorney, Agent, or Firm*—W. Daniel Swayze, Jr.; W. James Brady; Frederick J. Telecky, Jr.

(57) ABSTRACT

The circuit configuration for the generation of a reference voltage (Vref) contains a reference voltage source (12) and a storage capacitor (C2) to which a voltage provided by a reference voltage source (12) can be applied via a controllable switch. The charging voltage of this storage capacitor (C1) is the reference voltage to be generated. The controllable switch (P1) is a MOS field-effect transistor with back gate (24) which, by means of a refresh signal supplied by a control circuit (22), can be put periodically into either a conducting or a non-conducting state. The back gate (24) of the MOS fieldeffect transistor (P1) is connected to an auxiliary storage capacitor (C2) to which the voltage supplied by the reference voltage source (12) can be applied via a further switch, consisting of a MOS field-effect transistor (P2) with back gate (26), and which is also controlled by the refresh signal. The back gate (26) of the further MOS field-effect transistor (P2) is connected to a fixed voltage, which is greater than the voltage supplied by the reference voltage source (12).

3 Claims, 1 Drawing Sheet

CIRCUIT CONFIGURATION FOR THE GENERATION OF A REFERENCE VOLTAGE

FIELD OF THE INVENTION

The present invention relates to a circuit configuration for the generation of a reference voltage, with a reference voltage source and a storage capacitor to which a voltage provided by a reference voltage source can be applied via a controllable switch, and whose charging voltage is the reference voltage to be generated, whereby the controllable switch is a MOS field-effect transistor with back gate which, by means of a refresh signal supplied by a control circuit, can be put periodically into either a conducting or a non-conducting state.

BACKGROUND OF THE INVENTION

A circuit configuration with which the supply voltage of digital systems can be monitored is known from the application report SLVA 091 of Texas Instruments. This circuit configuration comprises a circuit section which generates the reference voltage required for the monitoring process. In an attempt to make the monitoring circuit as current saving as possible, the sample-and-hold principle is used by the circuit section for the generation of the reference voltage. This means that the reference voltage source is not continually operative, but is only switched into action periodically, each time for a short span of time. To ensure that the required reference voltage is nevertheless available on a continuous basis, it is stored in a capacitor which is connected by means of a switch during the time periods whenever the reference voltage source is active. The charging current of the capacitor is used as the required reference voltage. The switch between the reference voltage source and the capacitor is made by a MOS field-effect transistor which has a certain leakage current, leading to a discharge of the capacitor and, as a consequence, to a drop of the reference voltage stored. This leakage current therefore determines the time intervals after which the reference voltage source must be made active once again. In the circuit configuration known, no specific measures have been taken to reduce the leakage current of the MOS field-effect transistor used as switch between the reference voltage source and the capacitor.

SUMMARY OF THE INVENTION

The invention rests on the requirement of providing a circuit configuration of the type previously indicated, which supplies the reference voltage on a continuous basis and with high precision, and whose current consumption can be kept very low.

According to the invention, this requirement is satisfied in that the back gate of the MOS field-effect transistor is connected to an auxiliary storage capacitor to which the voltage supplied by the reference voltage source can be applied via a further switch, including a MOS field-effect transistor with a back gate, also controlled by the refresh signal, whereby a fixed voltage, which is greater than the voltage supplied by the reference voltage source, is applied to the back gate of the further MOS field-effect transistor.

In the circuit configuration according to the invention, the leakage current of the switch between the reference voltage source and the storage capacitor is reduced to a very low level in that the back gate of the MOS field-effect transistor used in this switch is kept at practically the same voltage level as the one supplied by the reference voltage source and which is also present at the storage capacitor. Because of the lack of any noticeable voltage difference between the back gate and the terminal of the MOS field-effect transistor connected to the storage capacitor, leakage of current through the back gate is now prevented. Since the charging voltage at the storage capacitor is thereby maintained for a long time, the time intervals, after which the reference voltage source has to be made active again, can be very long, thus resulting in a correspondingly reduced current consumption of the circuit configuration.

DETAILED DESCRIPTION OF THE DRAWINGS

Figure 2:
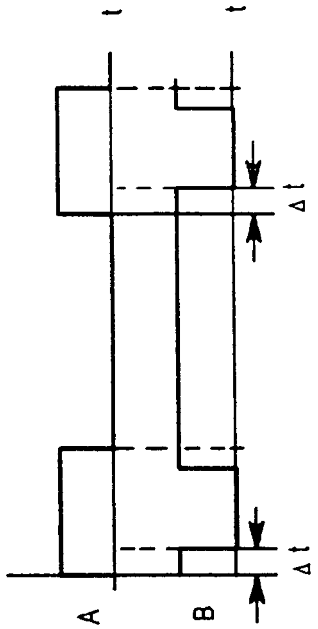
FIG. 2 illustrates an explanatory signal diagram.

The circuit configuration 10 contains a reference voltage source 12, operating according to the known band gap principle, which supplies a highly constant voltage at its output 14. The supply voltage VDD is fed to the reference voltage source 12 via its terminal 16, and terminal 18 is connected to ground via a switch SI, which can be closed and opened periodically in a manner still to be described.

The voltage delivered by the reference voltage source 12 is fed, via a MOS field-effect transistor PI, which acts as a switch, to an output 20 which is also connected to a storage capacitor CI. The charging voltage of the capacitor C1 constitutes in each case the reference voltage Vref which is made available at the output 20. In the example described, the MOS field-effect transistor PI is a PMOS field-effect transistor.

The MOS field-effect transistor P1 is periodically put into the conducting and into the non-conducting state by means of refresh signals provided by a control circuit 22. The control circuit 22 also provides at the same time a control signal for the control of switch SI, as well as for a further switch S2 still to be explained.

Figure 1:
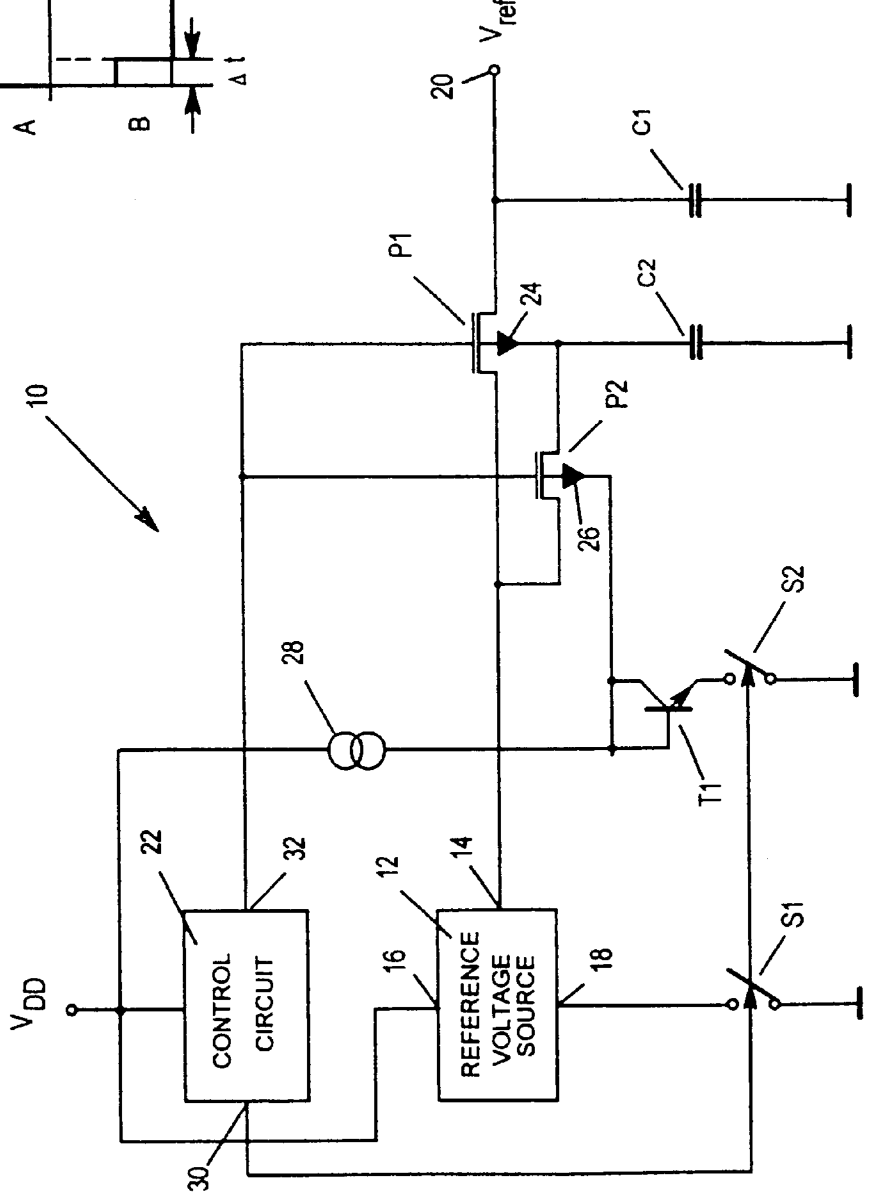
FIG. 1 illustrates a schematic circuit diagram of the circuit configuration according to the invention.

As shown in FIG. 1, the back gate 24 of the MOS field-effect transistor PI is connected to the output 14 of the reference voltage source 12 via the source-drain path of a further MOS field-effect transistor P2. This MOS field-effect transistor P2, which also acts as a switch, is also controlled by the refresh signal produced by the control circuit 22. The MOS field-effect transistor P2 is also a PMOS field-effect transistor. The back gate 24 of the MOS field-effect transistor PI is connected to an auxiliary capacitor C2, which is charged to the voltage present at the output 14 of the reference voltage source 12 whenever the MOS field-effect transistor P2 is in its conducting state.

The back gate 26 of the MOS field-effect transistor P2 is connected to the interconnected base and collector terminals of a bipolar transistor T1, the emitter of which can be connected to ground by means of the switch S2. The back gate 26 is furthermore connected to a current source 28 which, in turn, is connected to the supply voltage rail VDD. The transistor T1 acts as a diode, so that the base-emitter voltage $V_{BE}$ of this transistor TI is present at the back gate 26 of the MOS field-effect transistor P2 when the switch S2 is closed.

The circuit configuration represented in FIG. 1 operates as follows:

To activate the reference voltage source 12, the control circuit 22 outputs a control signal at its output 30 which causes the switch S1 to close. The same control signal also causes the switch S2 to close, so that current can flow from the supply voltage rail via the current source 28 and the bipolar transistor T1, connected in diode mode, which causes a voltage to be present at the back gate 26 of the MOS field-effect transistor P2, corresponding to the usual forward voltage of a diode. The temporal progression of the control signal can be seen at A in the diagram of FIG. 2 whereby the switches S1 and S2 are always closed whenever this signal has the value H, while the switches will be open whenever the signal has the value L.

Since the reference voltage source 12 takes a certain time until it can supply the precise voltage at its output 14, the MOS field-effect transistor P1 is put into its conductive state only after a short delay with respect to the activation of the reference voltage source 12 by means of the control signal supplied by the control circuit 22 at its output 32, so that the voltage present at the output 14 can charge the storage capacitor C1, whereby its charging voltage is available as the required reference voltage Vref at its output 20.

FIG. 2 shows at B the control signal provided by the control circuit 22 at its output 32, where it can be seen that this control signal acquires the signal value L when shifted by the time span At with respect to the control signal represented at A, which causes the MOS field-effect transistor PI to go into its conducting state.

The control signal delivered by the control circuit 22 at its output 32 is also applied to the gate terminal of the MOS field-effect transistor P2, so that this transistor, at the same time as the MOS field-effect transistor P1, also goes into its conducting state. The consequence of this is that the back gate 24 is connected to the voltage present at the output 14 of the reference voltage source 12. The same voltage is therefore present both at the back gate 24 as well as at the drain terminal of the MOS field-effect transistor P1, connected to the output 20.

The back gate of the MOS field-effect transistor P2 can be connected to the supply voltage VDD, but in the preferred embodiment example according to FIG. 1 it is connected to a voltage that corresponds to a diode forward voltage, that is a voltage lower than the supply voltage VDD. It should, however, always be made certain that a voltage is present at this back gate 26 that is greater than the voltage supplied by the reference voltage source 12 at its output 14. This ensures that the MOS field-effect transistor P2 will have a very low internal resistance when in its conducting state. The auxiliary capacitor C2, connected to the back gate 24, stores this voltage, so that this voltage is maintained even when the control signal at the output 32 of the control circuit 22 causes the MOS field-effect transistors P1 and P2 to revert to their cutoff state, and the switches SI and S2 to open in response to the signal output by the control circuit 22 from its output 30.

A charging voltage equal to the reference voltage Vref will now be present at both the capacitors C1 and C2, so that only a negligible leakage current can drain away via the back gate 24 of the MOS field-effect transistor PI. The charging voltage at the storage capacitor CI therefore remains steady for a long time, so that the time periods prior to a renewed activation of the reference voltage source 12 and the consequent refresh cycle of the charging voltage of the storage capacitor C1 can be made relatively long. Since the circuit configuration consumes current only during the active state of the reference voltage source 12, the entire current consumption of the circuit configuration is kept at a very low level.

Although the ideal condition, whereby the same voltage is present at both the back gate 26 and at the drain terminal 40 connected to the back gate 24, does not prevail at the MOS field-effect transistor P2, the difference between the voltages at the capacitors C1 and C2 however remains low, in the order of a few mV. The charging current of the auxiliary capacitor C2 changes very little, so that the voltage level relationships at the MOS field-effect transistor P1, that prevent the leakage current, remain effective over a long period of time.

By virtue of its behavior as explained, the circuit configuration described is of advantageous application wherever a highly constant reference voltage is required and yet the current consumption must be kept to a minimum.

What is claimed is:

1. A circuit for the generation of a reference voltage, with a reference voltage source, comprising:

a storage capacitor connected to the reference voltage source to receive a voltage applied by a controllable switch and being charged to the reference voltage;

the controllable switch having a MOS field-effect transistor with a back gate;

a control circuit to apply a refresh signal to said back gate to put said MOS field-effect transistor periodically into either a conducting or a non-conducting state;

an auxiliary storage capacitor connected to the back gate and having the voltage applied by the reference voltage source; and, a further switch including a further MOS field-effect transistor with a further back gate and controlled by the refresh signal, wherein a fixed voltage, which is greater than the voltage supplied by the reference voltage source, the fixed voltage applied to the further back gate of the further MOS field-effect transistor.

2. The circuit according to claim 1, where the fixed voltage is the supply voltage (VDD) of the circuit.

3. The circuit according to claim 1, where the fixed voltage is the base-emitter voltage of a bipolar transistor, connected in diode mode, the bipolar transistor having interconnected base and collector terminals connected to the further back gate of the further MOS field-effect transistor, and to the supply voltage of the circuit configuration via a current source, wherein the emitter terminal can be connected to ground by a further switch which is always closed whenever the further MOS field-effect transistor is in its conducting state.

* * * * *